(12) United States Patent
Lin et al.

(10) Patent No.: US 11,803,127 B2
(45) Date of Patent: Oct. 31, 2023

(54) METHOD FOR DETERMINING ROOT CAUSE AFFECTING YIELD IN A SEMICONDUCTOR MANUFACTURING PROCESS

(71) Applicant: ASML NETHERLANDS B.V., Veldhoven (NL)

(72) Inventors: Chenxi Lin, Newark, CA (US); Cyrus Emil Tabery, San Jose, CA (US); Hakki Ergün Cekli, Eindhoven (NL); Simon Philip Spencer Hastings, San Jose, CA (US); Boris Menchtchikov, Redwood City, CA (US); Yi Zou, Foster City, CA (US); Yana Cheng, San Jose, CA (US); Maxime Philippe Frederic Genin, San Mateo, CA (US); Tzu-Chao Chen, Dublin, CA (US); Davit Harutyunyan, San Jose, CA (US); Youping Zhang, Cupertino, CA (US)

(73) Assignee: ASML NETHERLANDS B.V., Veldhoven (NL)

( * ) Notice: Subject to any disclaimer, the term of this patent is extended or adjusted under 35 U.S.C. 154(b) by 72 days.

(21) Appl. No.: 17/295,193

(22) PCT Filed: Nov. 4, 2019

(86) PCT No.: PCT/EP2019/080129
§ 371 (c)(1),
(2) Date: May 19, 2021

(87) PCT Pub. No.: WO2020/114692
PCT Pub. Date: Jun. 11, 2020

(65) Prior Publication Data
US 2021/0389677 A1    Dec. 16, 2021

Related U.S. Application Data

(60) Provisional application No. 62/776,568, filed on Dec. 7, 2018.

(51) Int. Cl.
*G03F 7/00*     (2006.01)
*G05B 13/02*    (2006.01)
(Continued)

(52) U.S. Cl.
CPC ........... *G03F 7/705* (2013.01); *G05B 13/027* (2013.01); *G05B 19/41875* (2013.01);
(Continued)

(58) Field of Classification Search
CPC ... G03F 7/705; G03F 7/70616; G05B 13/027; G05B 19/41875; G05B 2219/32193;
(Continued)

(56) References Cited

U.S. PATENT DOCUMENTS

| 5,229,872 | A | 7/1993 | Mumola |
| 5,296,891 | A | 3/1994 | Vogt et al. |

(Continued)

FOREIGN PATENT DOCUMENTS

| CN | 103336239 | 10/2013 |
| EP | 3309617 | 4/2018 |

(Continued)

OTHER PUBLICATIONS

Chen, F. L., and S. F. Liu, "A neural network approach to recognize defect spatial pattern in semiconductor fabrication", IEEE Transaction on Semiconductors Manufacturing, vol. 13, pp. 366-373., Aug. 2000. (Year: 2000).*

(Continued)

*Primary Examiner* — Thomas C Lee
*Assistant Examiner* — Tyler Dean Hedrick
(74) *Attorney, Agent, or Firm* — Pillsbury Winthrop Shaw Pittman, LLP

(57) ABSTRACT

A method for determining a root cause affecting yield in a process for manufacturing devices on a substrate, the method including: obtaining yield distribution data including a distribution of a yield parameter across the substrate or part thereof; obtaining sets of metrology data, each set including a spatial variation of a process parameter over the substrate or part thereof corresponding to a different layer of the substrate; comparing the yield distribution data and metrology data based on a similarity metric describing a spatial similarity between the yield distribution data and an individual set out of the sets of the metrology data; and determining a first similar set of metrology data out of the sets of metrology data, being the first set of metrology data in terms of processing order for the corresponding layers, which is determined to be similar to the yield distribution data.

20 Claims, 3 Drawing Sheets

(51) Int. Cl.
  *G05B 19/418* (2006.01)
  *H01L 21/66* (2006.01)
(52) U.S. Cl.
  CPC .... *H01L 22/20* (2013.01); *G05B 2219/32193* (2013.01); *G05B 2219/32368* (2013.01); *G05B 2219/45031* (2013.01)
(58) Field of Classification Search
  CPC ........... G05B 2219/32368; G05B 2219/45031; H01L 22/20
  See application file for complete search history.

(56) References Cited

U.S. PATENT DOCUMENTS

| | | | |
|---|---|---|---|
| 5,523,193 A | 6/1996 | Nelson | |
| 5,844,850 A * | 12/1998 | Tsutsui | H01L 22/20 714/799 |
| 6,303,394 B1 * | 10/2001 | Steffan | H01L 22/20 700/121 |
| 6,516,433 B1 * | 2/2003 | Koenig | H01L 22/20 714/736 |
| 6,952,253 B2 | 10/2005 | Lof et al. | |
| 2006/0016561 A1 | 1/2006 | Choi et al. | |
| 2007/0085991 A1 | 4/2007 | Liegl et al. | |
| 2010/0214550 A1 | 8/2010 | Hulsebos et al. | |
| 2012/0008127 A1 | 1/2012 | Tel et al. | |
| 2013/0174102 A1 * | 7/2013 | Leu | G05B 19/41875 716/52 |
| 2017/0206662 A1 * | 7/2017 | Wang | G06T 7/143 |
| 2018/0275189 A1 | 9/2018 | Price et al. | |
| 2019/0057499 A1 * | 2/2019 | Dekel-Klein | G06T 7/001 |
| 2019/0086810 A1 | 3/2019 | Tel et al. | |
| 2020/0233311 A1 | 7/2020 | Kubis et al. | |
| 2020/0356881 A1 | 11/2020 | Bastani et al. | |

FOREIGN PATENT DOCUMENTS

| | | |
|---|---|---|
| EP | 3312672 | 4/2018 |
| EP | 3312693 | 4/2018 |
| EP | 3382606 | 10/2018 |
| JP | 2000-353729 | 12/2000 |
| WO | 99/49504 | 9/1999 |
| WO | 2011081645 | 7/2011 |
| WO | 2013092106 | 6/2013 |
| WO | 2015101458 | 7/2015 |
| WO | 2015110191 | 7/2015 |
| WO | 2017060080 | 4/2017 |
| WO | 2017067748 | 4/2017 |
| WO | 2017140532 | 8/2017 |
| WO | 2018072962 | 4/2018 |
| WO | 2018077651 | 5/2018 |
| WO | 2018092718 | 5/2018 |
| WO | 2018202361 | 11/2018 |

OTHER PUBLICATIONS

M. Wu et al., "Wafer Map Failure Pattern Recognition and Similarity for Large-Scale Data Sets", IEEE Transactions on Semiconductor Manufacturing, vol. 28, No. 1, pp. 1-12 (Feb. 2015).

International Search Report issued in corresponding PCT Patent Application No. PCT/EP2019/080129, dated Feb. 20, 2020.

Hessinger, U, et al.: "Data Mining for Significance in Yield-Defect Correlation Analysis", IEEE Transactions on Semiconductor Manufacturing, vol. 27, No. 3, pp. 347-356 (Aug. 1, 2014).

Office Action issued in corresponding Korean Patent Application No. 10-2021-7017313, dated Aug. 24, 2023.

* cited by examiner

METHOD FOR DETERMINING ROOT CAUSE AFFECTING YIELD IN A SEMICONDUCTOR MANUFACTURING PROCESS

CROSS-REFERENCE TO RELATED APPLICATIONS

This application is the U.S. national phase entry of PCT Patent Application No. PCT/EP2019/080129 which was filed Nov. 4, 2019, which claims the benefit of priority of U.S. Patent Application No. 62/776,568 which was filed on Dec. 7, 2018 and which is incorporated herein in its entirety by reference.

FIELD

The present invention relates to semiconductor manufacturing processes, in particular methods to root causes which affect yield on substrates subject to the process.

BACKGROUND

A lithographic apparatus is a machine constructed to apply a desired pattern onto a substrate. A lithographic apparatus can be used, for example, in the manufacture of integrated circuits (ICs). A lithographic apparatus may, for example, project a pattern (also often referred to as "design layout" or "design") at a patterning device (e.g., a mask) onto a layer of radiation-sensitive material (resist) provided on a substrate (e.g., a wafer).

To project a pattern on a substrate a lithographic apparatus may use electromagnetic radiation. The wavelength of this radiation determines the minimum size of features which can be formed on the substrate. Typical wavelengths currently in use are 365 nm (i-line), 248 nm, 193 nm and 13.5 nm. A lithographic apparatus, which uses extreme ultraviolet (EUV) radiation, having a wavelength within the range 4-20 nm, for example 6.7 nm or 13.5 nm, may be used to form smaller features on a substrate than a lithographic apparatus which uses, for example, radiation with a wavelength of 193 nm.

Low-$k_1$ lithography may be used to process features with dimensions smaller than the classical resolution limit of a lithographic apparatus. In such process, the resolution formula may be expressed as $CD = k_1 \times \lambda / NA$, where $\lambda$ is the wavelength of radiation employed, NA is the numerical aperture of the projection optics in the lithographic apparatus, CD is the "critical dimension" (generally the smallest feature size printed, but in this case half-pitch) and $k_1$ is an empirical resolution factor. In general, the smaller $k_1$ the more difficult it becomes to reproduce the pattern on the substrate that resembles the shape and dimensions planned by a circuit designer in order to achieve particular electrical functionality and performance. To overcome these difficulties, sophisticated fine-tuning steps may be applied to the lithographic projection apparatus and/or design layout. These include, for example, but not limited to, optimization of NA, customized illumination schemes, use of phase shifting patterning devices, various optimization of the design layout such as optical proximity correction (OPC, sometimes also referred to as "optical and process correction") in the design layout, or other methods generally defined as "resolution enhancement techniques" (RET). Alternatively, tight control loops for controlling a stability of the lithographic apparatus may be used to improve reproduction of the pattern at low k1.

These tight control loops are generally based on metrology data obtained using a metrology tool measuring characteristics of the applied pattern or of metrology targets representing the applied pattern. In general the metrology tool is based on optical measurement of the position and/or dimensions of the pattern and/or targets. It is intrinsically assumed that these optical measurements are representative for a quality of the process of manufacturing of the integrated circuits.

In addition to control based on optical measurements, also e-beam based measurements may be performed; among which a so-called low voltage measurement using an e-beam tool (as offered by HMI) may be utilized. Such a low voltage contrast measurement is indicative of the quality of electrical contact between layers applied to the substrate.

Typically after all process steps have been completed each die on the substrate should be suitable to yield a functional semiconductor device (IC). In principle before further packaging of the IC is pursued each die is subject to electrical testing using various techniques, among which electrical probing. Electrical probing is normally done at multiple locations across the die, measuring multiple electrical properties (for example voltage, resistance, frequency, each parameter referred to as a specific bin code). The values of the bin codes are a good indicator of the quality of the IC; for example when a measured resistance is very high this may indicate that electrical contact between components is not achieved and hence chances are very low that the IC will be functional. If testing of the electrical properties of the substrates conveys a large number of non-functional ICs it may be assumed that the manufacturing process has a low yield.

Disadvantage of the testing at the final stage of IC production is that only after execution of all process steps and layers can it be determined whether the yield of the process regarding delivering a minimum desired ratio of functional ICs to non-functional ICs meets certain criteria, and investigation into root causes for non-functional ICs can be made.

SUMMARY

It is an object of the inventors to address the mentioned disadvantages of the state of the art.

In a first aspect of the invention the is provided a method for determining a root cause affecting yield in a manufacturing process for manufacturing a substrate, the method comprising; obtaining yield distribution data comprising the distribution of a yield parameter over the substrate or part thereof; obtaining a plurality of sets of metrology data comprising a spatial variation of a process parameter over the substrate or part thereof, each set of the metrology data corresponding to a different layer of the substrate; comparing the yield distribution data and metrology data, wherein the comparing comprises determining a similarity metric describing a spatial similarity between the yield distribution data and at least a selection of sets out of the plurality of sets of the metrology data; and determining a first similar set of metrology data out of the selection of sets of metrology data, being the first set of metrology data in terms of processing order for the corresponding layers, which is determined to be similar to the yield distribution data.

In a second aspect of the invention, there is provided a method for monitoring a manufacturing process for manufacturing a substrate, the method comprising; obtaining a trained model relating yield distribution data and metrology data, said trained model being trained by comparison of training sets of metrology data and training yield distribution data corresponding to said manufacturing process; obtaining sets of production metrology data, each set comprising a spatial variation of a process parameter corresponding to a different layer of the substrate or part thereof; using the trained model to determine a similarity metric for each of the sets of production metrology data to one or more failure patterns in the historic yield distribution data comprising a particular yield failure pattern; and flagging a potential issue if the similarity metric exceeds a threshold.

BRIEF DESCRIPTION OF THE DRAWINGS

Embodiments of the invention will now be described, by way of example only, with reference to the accompanying schematic drawings, in which.

DETAILED DESCRIPTION

In the present document, the terms "radiation" and "beam" are used to encompass all types of electromagnetic radiation, including ultraviolet radiation (e.g. with a wavelength of 365, 248, 193, 157 or 126 nm) and EUV (extreme ultra-violet radiation, e.g. having a wavelength in the range of about 5-100 nm).

The term "reticle", "mask" or "patterning device" as employed in this text may be broadly interpreted as referring to a generic patterning device that can be used to endow an incoming radiation beam with a patterned cross-section, corresponding to a pattern that is to be created in a target portion of the substrate; the term "light valve" can also be used in this context. Besides the classic mask (transmissive or reflective; binary, phase-shifting, hybrid, etc.), examples of other such patterning devices include:
  a programmable mirror array. More information on such mirror arrays is given in U.S. Pat. Nos. 5,296,891 and 5,523,193, which are incorporated herein by reference.
  a programmable LCD array. An example of such a construction is given in U.S. Pat. No. 5,229,872, which is incorporated herein by reference.

Figure 1:
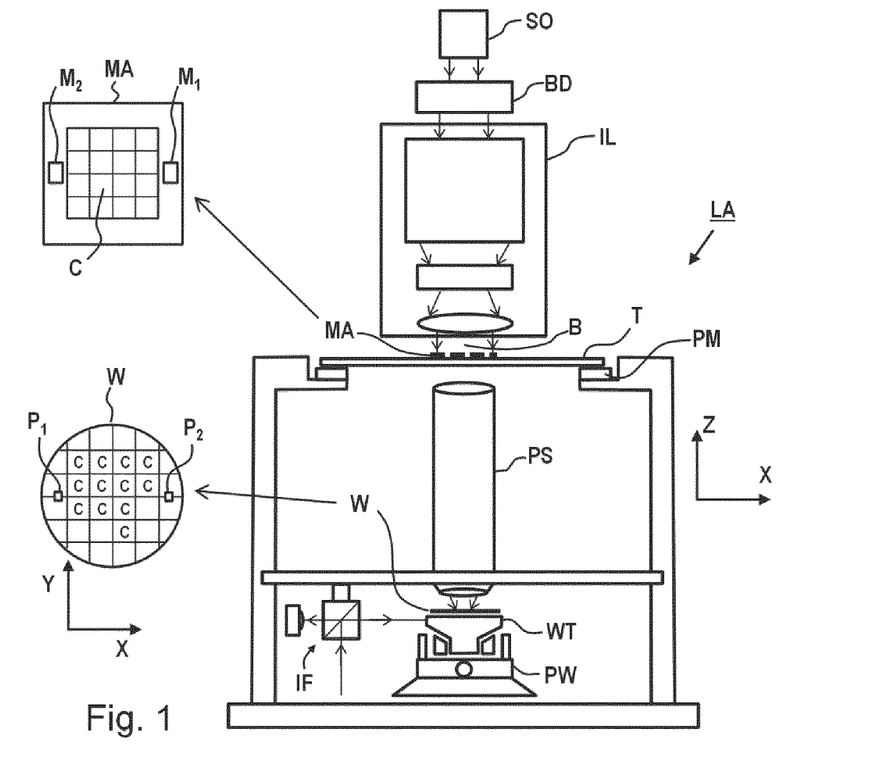
FIG. 1 depicts a schematic overview of a lithographic apparatus.

FIG. 1 schematically depicts a lithographic apparatus LA. The lithographic apparatus LA includes an illumination system (also referred to as illuminator) IL configured to condition a radiation beam B (e.g., UV radiation, DUV radiation or EUV radiation), a support structure (e.g., a mask table) MT constructed to support a patterning device (e.g., a mask) MA and connected to a first positioner PM configured to accurately position the patterning device MA in accordance with certain parameters, a substrate table (e.g., a wafer table) WT constructed to hold a substrate (e.g., a resist coated wafer—wafer and substrate are synonymous and will be used interchangeably throughout the disclosure) W and connected to a second positioner PW configured to accurately position the substrate in accordance with certain parameters, and a projection system (e.g., a refractive projection lens system) PS configured to project a pattern imparted to the radiation beam B by patterning device MA onto a target portion C (e.g., comprising one or more dies) of the substrate W.

In operation, the illuminator IL receives a radiation beam from a radiation source SO, e.g. via a beam delivery system BD. The illumination system IL may include various types of optical components, such as refractive, reflective, magnetic, electromagnetic, electrostatic, or other types of optical components, or any combination thereof, for directing, shaping, or controlling radiation. The illuminator IL may be used to condition the radiation beam B to have a desired spatial and angular intensity distribution in its cross section at a plane of the patterning device MA.

The term "projection system" PS used herein should be broadly interpreted as encompassing various types of projection system, including refractive, reflective, catadioptric, anamorphic, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system" PS.

The lithographic apparatus may be of a type wherein at least a portion of the substrate may be covered by a liquid having a relatively high refractive index, e.g., water, so as to fill a space between the projection system and the substrate—which is also referred to as immersion lithography. More information on immersion techniques is given in U.S. Pat. No. 6,952,253 and in PCT publication No. WO99-49504, which are incorporated herein by reference.

The lithographic apparatus LA may also be of a type having two (dual stage) or more substrate tables WT and, for example, two or more support structure MT (not shown). In such "multiple stage" machines the additional tables/structures may be used in parallel, or preparatory steps may be carried out on one or more tables while one or more other tables are being used for exposing the design layout of the patterning device MA onto the substrate W.

In operation, the radiation beam B is incident on the patterning device (e.g., mask MA), which is held on the support structure (e.g., mask table MT), and is patterned by the patterning device MA. Having traversed the mask MA, the radiation beam B passes through the projection system PS, which focuses the beam onto a target portion C of the substrate W. With the aid of the second positioner PW and position sensor IF (e.g., an interferometric device, linear encoder, 2-D encoder or capacitive sensor), the substrate table WT can be moved accurately, e.g., so as to position different target portions C in the path of the radiation beam B. Similarly, the first positioner PM and possibly another position sensor (which is not explicitly depicted in FIG. 1) may be used to accurately position the mask MA with respect to the path of the radiation beam B. Mask MA and substrate W may be aligned using mask alignment marks M1, M2 and substrate alignment marks P1, P2. Although the substrate alignment marks as illustrated occupy dedicated target portions, they may be located in spaces between target portions (these are known as scribe-lane alignment marks).

Figure 2:
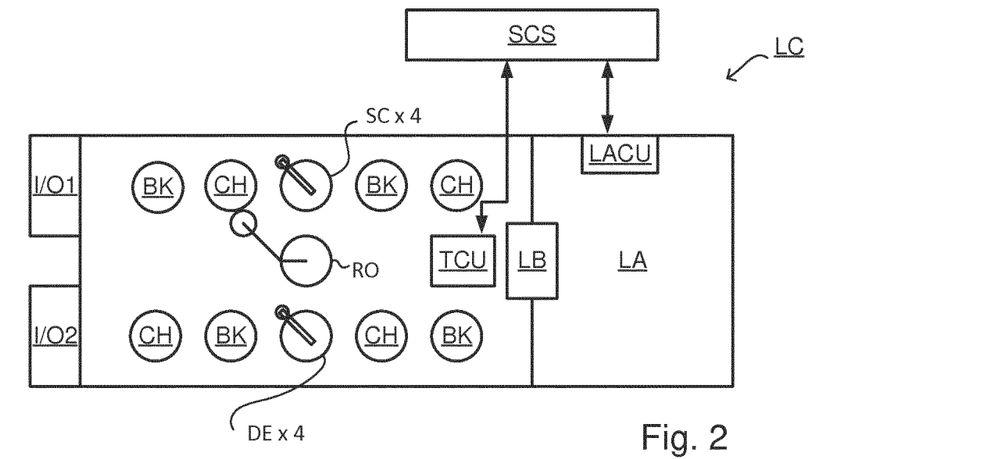
FIG. 2 depicts a schematic overview of a lithographic cell.

As shown in FIG. 2 the lithographic apparatus LA may form part of a lithographic cell LC, also sometimes referred to as a lithocell or (litho)cluster, which often also includes apparatus to perform pre- and post-exposure processes on a substrate W. Conventionally these include spin coaters SC to deposit resist layers, developers DE to develop exposed resist, chill plates CH and bake plates BK, e.g. for conditioning the temperature of substrates W e.g. for conditioning solvents in the resist layers. A substrate handler, or robot, RO picks up substrates W from input/output ports I/O1, I/O2, moves them between the different process apparatus and delivers the substrates W to the loading bay LB of the lithographic apparatus LA. The devices in the lithocell, which are often also collectively referred to as the track, are typically under the control of a track control unit TCU that in itself may be controlled by a supervisory control system SCS, which may also control the lithographic apparatus LA, e.g. via lithography control unit LACU.

In order for the substrates W exposed by the lithographic apparatus LA to be exposed correctly and consistently, it is desirable to inspect substrates to measure properties of patterned structures, such as overlay errors between subsequent layers, line thicknesses, critical dimensions (CD), etc. For this purpose, inspection tools (not shown) may be included in the lithocell LC. If errors are detected, adjustments, for example, may be made to exposures of subsequent substrates or to other processing steps that are to be performed on the substrates W, especially if the inspection is done before other substrates W of the same batch or lot are still to be exposed or processed.

An inspection apparatus, which may also be referred to as a metrology apparatus, is used to determine properties of the substrates W, and in particular, how properties of different substrates W vary or how properties associated with different layers of the same substrate W vary from layer to layer. The inspection apparatus may alternatively be constructed to identify defects on the substrate W and may, for example, be part of the lithocell LC, or may be integrated into the lithographic apparatus LA, or may even be a stand-alone device. The inspection apparatus may measure the properties on a latent image (image in a resist layer after the exposure), or on a semi-latent image (image in a resist layer after a post-exposure bake step PEB), or on a developed resist image (in which the exposed or unexposed parts of the resist have been removed), or even on an etched image (after a pattern transfer step such as etching).

Figure 3:
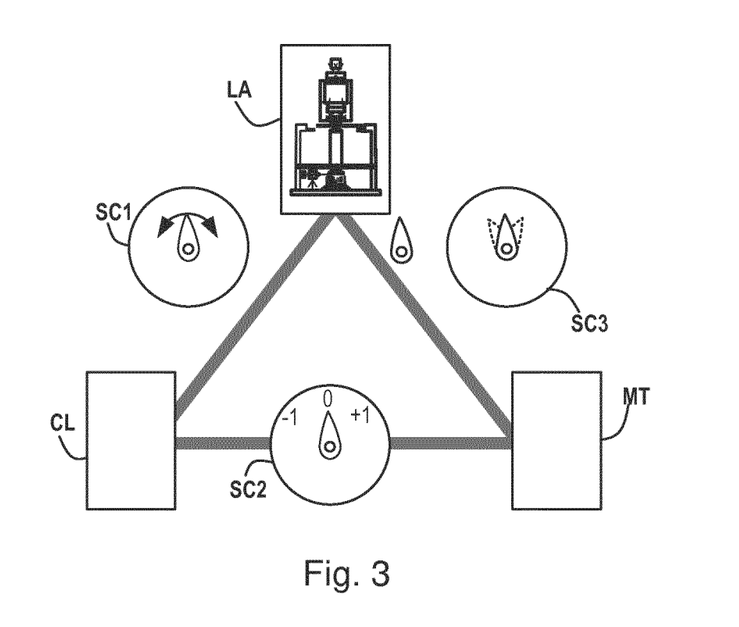
FIG. 3 depicts a schematic representation of holistic lithography, representing cooperation between three key technologies to optimize semiconductor manufacturing.

Typically the patterning process in a lithographic apparatus LA is one of the most critical steps in the processing which requires high accuracy of dimensioning and placement of structures on the substrate W. To ensure this high accuracy, three systems may be combined in a so called "holistic" control environment as schematically depicted in FIG. 3. One of these systems is the lithographic apparatus LA which is (virtually) connected to a metrology tool MT (a second system) and to a computer system CL (a third system). The key of such "holistic" environment is to optimize the cooperation between these three systems to enhance the overall process window and provide tight control loops to ensure that the patterning performed by the lithographic apparatus LA stays within a process window. The process window defines a range of process parameters (e.g. dose, focus, overlay) within which a specific manufacturing process yields a defined result (e.g. a functional semiconductor device)—typically within which the process parameters in the lithographic process or patterning process are allowed to vary.

The computer system CL may use (part of) the design layout to be patterned to predict which resolution enhancement techniques to use and to perform computational lithography simulations and calculations to determine which mask layout and lithographic apparatus settings achieve the largest overall process window of the patterning process (depicted in FIG. 3 by the double white arrow in the first scale SC1). Typically, the resolution enhancement techniques are arranged to match the patterning possibilities of the lithographic apparatus LA. The computer system CL may also be used to detect where within the process window the lithographic apparatus LA is currently operating (e.g. using input from the metrology tool MT), so as to predict whether defects may be present due to e.g. sub-optimal processing (depicted in FIG. 3 by the arrow pointing "0" in the second scale SC2).

The metrology tool MT may provide input to the computer system CL to enable accurate simulations and predictions, and may provide feedback to the lithographic apparatus LA to identify possible drifts, e.g. in a calibration status of the lithographic apparatus LA (depicted in FIG. 3 by the multiple arrows in the third scale SC3).

The lithographic apparatus LA is configured to accurately reproduce the pattern onto the substrate. The positions and dimensions of the applied features need to be within certain tolerances. Position errors may occur due to an overlay error (often referred to as "overlay"). The overlay is the error in placing a first feature during a first exposure relative to a second feature during a second exposure. The lithographic apparatus minimizes the overlay errors by aligning each wafer accurately to a reference prior to patterning. This is done by measuring positions of alignment marks on the substrate using an alignment sensor. More information on the alignment procedure can be found in U.S. Patent Application Publication No. US20100214550, which is incorporated herein by reference. Pattern dimensioning (e.g., CD) errors may, for example, occur when the substrate is not positioned correctly with respect to a focal plane of the lithographic apparatus. These focal position errors may be associated with un-flatness of a substrate surface. The lithographic apparatus minimizes these focal position errors by measuring the substrate surface topography prior to patterning using a level sensor. Substrate height corrections are applied during subsequent patterning to assure correct imaging (focusing) of the patterning device onto the substrate. More information on the level sensor system can be found in U.S. Patent Application Publication No. US20070085991, which is incorporated herein by reference.

Besides the lithographic apparatus LA and the metrology apparatus MT other processing apparatus may be used during IC production as well. An etching station (not shown) processes the substrates after exposure of the pattern into the resist. The etch station transfers the pattern from the resist into one or more layers underlying the resist layer. Typically etching is based on application of a plasma medium. Local etching characteristics may, for example, be controlled using temperature control of the substrate or directing the plasma medium using a voltage controlled ring. More information on etching control can be found in international Patent Application Publication No. WO2011081645 and U.S. Patent Application Publication No. US 20060016561 which are incorporated herein by reference.

During the manufacturing of the ICs, it is of great importance that the process conditions for processing substrates using processing apparatus, such as the lithographic apparatus or etching station, remain stable such that properties of the features remain within certain control limits. Stability of the process is of particular importance for features of the functional parts of the IC, i.e., the product features. To guarantee stable processing, process control capabilities need to be in place. Process control involves monitoring of processing data and implementation of means for process correction, e.g. control the processing apparatus based on characteristics of the processing data. Process control may be based on periodic measurement by the metrology apparatus MT, often referred to as "Advanced Process Control" (further also referenced to as APC). More information on APC can be found in U.S. Patent Application Publication No. US20120008127, which is incorporated herein by reference. A typical APC implementation involves periodic measurements on metrology features on the substrates to monitor and correct drifts associated with one or more processing apparatus. The metrology features reflect the response to process variations of the product features. The sensitivity of the metrology features to process variations may be different compared to the sensitivity of the product features. In that case, a so-called "Metrology To Device" offset (further also referenced to as MTD) may be determined. To mimic the behavior of product features, the metrology targets may incorporate segmented features, assist features or features with a particular geometry and/or dimension. A carefully designed metrology target should respond in a similar fashion to process variations as the product features. More information on metrology target design can be found in international Patent Application Publication No. WO 2015101458 which is incorporated herein by reference.

The distribution of locations across the substrate and/or patterning device where metrology targets are present and/or measured is often referred to as a "sampling scheme". Typically the sampling scheme is selected based on an expected fingerprint of the relevant process parameter(s); areas on the substrate where a process parameter is expected to fluctuate are typically sampled more densely than areas where the process parameter is expected to be relatively stable. However, there is a practical limit to the number of metrology measurements which can be performed, based on the allowable impact of the metrology measurements on the throughput of the lithographic process. A carefully selected sampling scheme is important to accurately control the lithographic process without affecting throughput (or at least affecting it too much) and/or assigning a too large area on the reticle or substrate to metrology features. Technology related to optimal positioning and/or measuring metrology targets is often referred to as "scheme optimization". More information on scheme optimization can be found in international Patent Application Publication No. WO 2015110191 and the European patent application, application number EP16193903.8 which are incorporated herein by reference.

The term fingerprint may refer to a main (systematic) contributor ("latent factor") of a measured signal, and in particular a contributor connected to the performance impact on-wafer or to previous processing steps. Such a fingerprint can refer to substrate (grid) patterns (e.g. from alignment, leveling, overlay, focus, CD), field patterns (e.g., from intrafield alignment, leveling, overlay, focus, CD), substrate zone patterns (e.g., outermost radius of wafer measurements) or even patterns in scanner measurements related to wafer exposure (e.g., heating signature through-lot from reticle alignment measurements, temperature/pressure/servo profiles, etc.). Fingerprints may be comprised within a fingerprint collection, and may be encoded homogenously or heterogeneously therein.

In addition to metrology measurement data, context data may be used for process control. Context data may comprise data relating to one or more of: the selected processing tools (out of the pool of processing apparatus), specific characteristics of the processing apparatus, the settings of the processing apparatus, the design of the circuit pattern and measurement data relating to processing conditions (for example wafer geometry). Examples of using context data for process control purposes may be found in European patent application, application number EP16156361.4, and international patent application, application number PCT/EP2016/072363 which are incorporated herein by reference. Context data may be used to control or predict processing in a feed-forward manner, where the context data relates to process steps performed before the currently controlled process step. Often context data is statistically correlated to product feature properties. This enables context driven control of processing apparatus in view of achieving optimal product feature properties. Context data and metrology data may also be combined e.g. to enrich sparse metrology data to an extent that more detailed (dense) data becomes available, which is more useful for control and/or diagnostic purposes. More information on combining context data and metrology data can be found in U.S. patent provisional application No. 62/382,764 which is incorporated herein by reference.

As said, monitoring the process is based on acquisition of data related to the process. The required data sampling rate (per lot or per substrate) and sampling density depend on the required level of accuracy of pattern reproduction. For low-k1 lithographic processes, even small substrate-to-substrate process variations may be significant. The context data and/or metrology data should then be sufficient to enable process control on a per-substrate basis. Additionally when a process variation gives rise to variations of a characteristic across the substrate, the density of the context and/or metrology data should be sufficiently distributed across the substrate. However the time available for metrology (measurements) is limited in view of the required throughput of the process. As a result of this limitation, the metrology tool may measure only on selected substrates and/or selected locations across the substrate. The strategies to determine which substrates need to be measured are further described in the European patent applications EP16195047.2 and EP16195049.8, which are incorporated herein by reference.

In practice, it is often necessary to derive a denser map of values from a sparse set of measurement values relating to a process parameter (across a substrate or plurality of substrates). Typically such a dense map of measurement values may be derived from the sparse measurement data in conjunction with a model associated with an expected fingerprint of the process parameter. More information on modeling measurement data can be found in international Patent Application Publication No. WO 2013092106 which is incorporated herein by reference. As a semiconductor manufacturing process involves multiple processing apparatuses (lithographic apparatus, etching stations, etc.), it may be beneficial to optimize the process as a whole; e.g., take specific correction capabilities associated with individual processing apparatus into account. This leads to the perspective that control of a first processing apparatus may be (partly) based on known control properties of a second processing apparatus. This strategy is commonly referred to as co-optimization. Examples of such a strategy include joint optimization of a lithographic apparatus and a density profile of a patterning device, and joint optimization of a lithographic apparatus and an etching station. More information on co-optimization may be found in international Patent application, application No. PCT/EP2016/072852 and U.S. Patent provisional application No. 62/298,882 which are incorporated herein by reference.

In some process control situations, the control objective may be, for example, "number of dies in spec". This describes a yield driven process control parameter which aims to obtain a maximum number of functional products per batch of processed substrates. Typically a product is associated with a die on a substrate and, as such, yield based process control is referred to as based on a "dies-in-spec" criterion. This aims to maximize the number of dies within specification, rather than applying an averaged optimization across the substrate (e.g., a least-squares optimization based on a least squares minimization of focus difference from best focus across the substrate). As such, a "dies-in-spec" optimization may use prior knowledge of the product (the die layout) when optimizing a process parameter. A least squares optimization typically treats each location equally, without taking into account the die layout. As such, a least squares optimization may prefer a correction which "only" has four locations out-of-specification, but each in a different die, over a correction which has seven locations out-of-specification, but only affecting two dies (e.g., four defects in one die, three in another). However, as a single defect will tend to render a die defective, maximizing the number of defect-free dies (i.e., dies-in-spec) is ultimately more important than simply minimizing the number of defects per substrate. A dies-in-spec optimization may comprise a maximum absolute (max abs) per die optimization. Such a max abs optimization may minimize the maximum deviation of the performance parameter from a control target. A differentiable approximation for the max abs function could be used instead, so that the cost function is easier to solve. For this to be effective, detail such as the wafer map should be used in the optimization. To obtain a good yield-based process control, a sampling scheme for metrology measurements may benefit from measurements performed at, on or near locations which are expected to be most critical for yield and/or may be statistically most relevant to determine whether yield is affected. In addition to measuring properties of product features, the occurrence of defects may be measured to further assist in optimizing the process for optimal yield (reference defect inspection). More information on yield based control may be found in PCT patent application WO2018077651, which is incorporated herein by reference.

In addition to performing metrology measurements on pre-defined locations and substrates, there is a trend to dynamically allocate the locations and substrates which need to be selected for measurement. An example of dynamically selecting substrates for measurements is described in PCT patent application WO2018072962 which is incorporated herein by reference. More information on dynamic selection of measurement locations (e.g., sampling schemes) may be found in PCT patent application WO2017140532 which is incorporated herein by reference.

A relatively new technology area is the domain of machine learning. Methods relating to this technology are nowadays used to improve prediction of process parameters based on recognition of patterns present within the acquired data (measurements and context data). Additionally machine learning techniques may be useful to guide the user in selecting the data that is most useful for process control purposes.

Electrical measurement data is typically obtained after processing of substrates. Typically, when performing electrical metrology to obtain the electrical measurement data, all the dies on the substrates are measured using probes which make (near) contact to the circuits formed during the processing. Various types of measurements may be performed; voltage, current, resistance, capacitance and inductance measurements, for example. These measurements may be performed under different conditions (frequencies, voltage, current for example) and at a plurality of locations across the die. The electrical measurement may comprise an evaluation of whether a particular structure/feature or device is functional (e.g., within specification). Alternatively, or in addition, the electrical measurement may be categorized according to "bin codes". An electrical measurement associated with a certain measured parameter (current, voltage, resistance, capacitance, inductance) at a certain condition is commonly referred to as a separate "bin code". Hence a typical electrical measurement across a die may be represented by a plurality of graphs, each graph representing a spatial distribution of values associated with a particular bin code. Throughout the text, "bin code" and "electrical characteristic" is used synonymously such that a value of a bin code associated with the substrate is referred to as a value of an electrical characteristic of the substrate. Electrical measurement data may also comprise bit asymmetry data or any other yield parameter.

The distribution of the measurement locations for which the electrical measurements need to be performed may not be constant, but may also depend on the relative position of the die on the substrate. Dies at the edge of the substrate may be more likely to have electrical defects, hence these dies may be sampled more densely than dies closer to the center of the substrate. Analogously, critical regions may be present within a die, such as those associated with functional logic structures, while less critical regions may be present, for example, at the periphery of the die. It is advantageous to provide denser electrical measurement sample schemes at the critical regions of the dies than at the less demanding regions.

The properties (minimum value, maximum value, variance or any other statistical measure) of the measured electrical characteristics are important indicators regarding the probability that a certain circuit on a die will be functional. Hence a strong relationship exists between the electrical characteristic and the yield of the process. Hence for yield control, electrical characteristic measurements are indispensable. However, they are also time consuming and are only performed at the end stage of the semiconductor manufacturing process (e.g. when options for correcting non-functional circuits are virtually absent).

To provide better yield correction capability to a semiconductor manufacturing process, it is proposed to predict the yield of a substrate based on data which is already available during the processing. During processing of the substrate multiple layers are deposited, patterned and etched. It is vital that patterns (features) provided on the substrate have well-defined properties in order to yield a functional device. For example features should be imaged at the correct focus position, have the correct critical dimensions (CD), correct edge placement (i.e., minimal edge placement error EPE) and have good overlay (i.e., each layer being aligned accurately to features associated with underlying layers). As stated previously, the lithographic apparatus (e.g., alignment system, leveling system) and the metrology apparatus (e.g., scatterometer or e-beam tool) play an important role in measuring these parameters, in some cases for all substrates within a lot.

When yield loss occurs, it is important to identify the root cause; i.e., the process fault (e.g., the [process, equipment] pair) which causes the yield loss issue. Most fabrication yield issues manifest themselves as a spatial signature or fingerprint in the wafer sort map (a yield distribution map resultant from electrical testing which is performed before the wafers are sawn and packaged). Conventional root cause analysis will typically perform commonality/correlation analysis between the wafer sort map fingerprint and the process history information (i.e., context data describing the substrate routing), in order to identify the process step/tool/tool attributes which are responsible for systematic yield excursions.

The main issues with the conventional root cause analysis flow described above are:
- There is a huge amount of context information to be analyzed. A substrate is typically subject to hundreds of different process steps before it reaches the end-of-line sort testing. For each of these process steps, there may be of the order of magnitude of tens of possible tools/chambers available for wafer processing. Furthermore, even for the same tool/chamber, the tool attribute can also vary and drift over time.
- There may be a potential correlation between some context variables (e.g., due to not-fully randomized wafer routing). This can degrade the accuracy of the root cause analysis and increase the time to insight, since human supervision/filtering of irrelevant process steps based on domain knowledge is required.

Once the root causes have been identified and confirmed by process engineers, a database can be built to store the systematic wafer sort map fingerprints together with the associated process root causes. When new wafers are processed and probed, the activation/presence for each fingerprint in the database can be computed and monitored through time, in order to detect the recurrence of process issues provided that the wafer sort map becomes available. Therefore, a main deficiency with a process failure recurrence monitoring system based on the conventional method described above is that it does not enable detection of process excursions until the wafer sort map data become available. This can be weeks later, during which the process issue may continue. All wafers processed within this time frame, (i.e., the time between when the wafer was processed at a particular step by the problematic/outlier tool and when the wafer was probed) will be subject to the yield excursion.

To address this, it is proposed to introduce wafer metrology, and in particular wafer metrology performed on the scanner (lithographic apparatus or exposure tool) into the root cause analysis flow and, optionally, also the excursion recurrence monitoring system. Such scanner metrology may comprise, for example, measured wafer maps from the leveling sensor and alignment sensor. The advantage of such scanner metrology is that it is performed and available for every single wafer at every single exposure step. The wafer metrology may, additionally or alternatively, comprise derived wafer maps. Such derived wafer maps may, for example, be derived from the scanner metrology. Example of derived wafer maps include:
- leveling information such as wafer height measurements. This information can provide insight into wafer focus drift, while its spatial gradient in the XY plane can indicate an overlay issue.
- Alignment measurement results using different colors/wavelengths can be used to derive multiple fingerprints, each of which have different sensitivities to different process steps.
- Alignment mark intensity wafer maps can also help reveal the nature of certain process steps such as deposition or etching.

Another important thing to note is that the spatial resolution of certain scanner metrology data such as alignment data is typically much lower than die-level, which is the spatial resolution of wafer sort/probe map. Therefore, a reliable and accurate interpolation algorithm may be used to reconstruct dense, die-level scanner metrology fingerprints from sparse, as-measured scanner metrology data. Such a Die-level metrology interpolation techniques is described in, for example, WO2018/202361, and U.S. provisional application 62/624,537. These documents are incorporated herein by reference.

Figure 4:
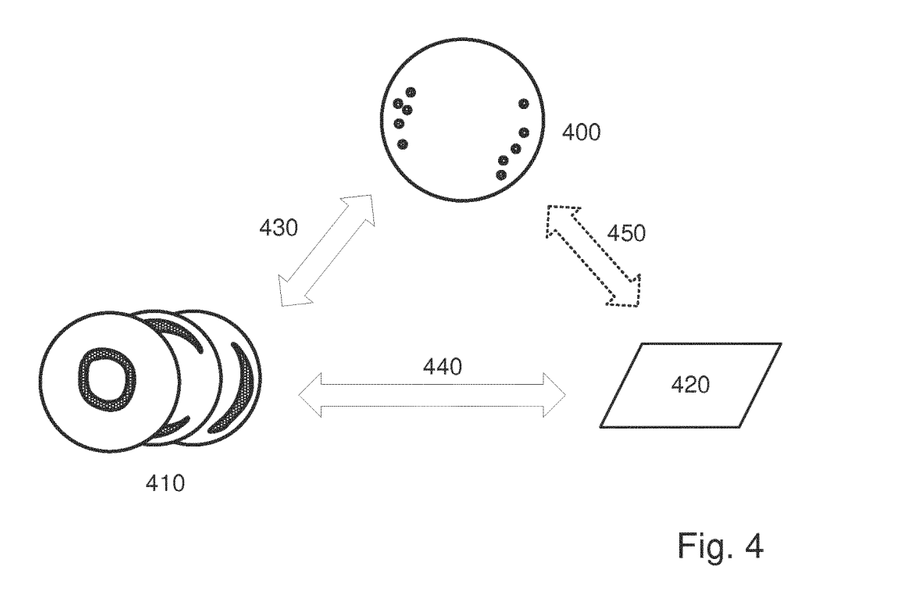
FIG. 4 is a root cause analysis method flow according to an embodiment of the invention.

FIG. 4 illustrates a method according for process learning in an improved root cause analysis method. It shows one or more sort map fingerprints (i.e., yield distribution data) 400, through-stack scanner metrology (i.e., scanner metrology for multiple, and preferably all, process layers) 410 and the wafer context data 420. These are linked via a first step 430 and second step 440. By way of contrast, the present methodology is illustrated by step 450, which comprises directly linking the wafer sort map fingerprints to the process history information. More specifically, the step 450 represents a wafer-level, fingerprint-based commonality analysis (CA) where wafers are automatically classified/similarity ranked based on their common sort/test map fingerprint, following which a human expert interactively selects the fingerprint category of interest and the system searches for the process steps that correlate best with the selected fingerprint.

Steps 430, 440 describe a two-step approach for a root cause analysis or a "process learning" phase. In step 430 a correlation analysis is performed between the wafer sort map 400 and the scanner metrology 410 (e.g., through-stack raw scanner metrology fingerprints and their derivatives) for all exposure layers. At step 440, the scanner metrology fingerprints 410 are linked to wafer context data 420 or processing history (e.g., using existing data mining techniques).

In an embodiment, the correlation analysis may be performed by measuring the spatial similarity (e.g., a fingerprint match) between the final wafer sort map fingerprint 400 and the scanner metrology fingerprint 410 from each individual layer, based on informative semantic feature vectors (e.g., encodings). These semantic feature vectors may be extracted by a pre-trained machine learning model (such as a neural network, more specifically a deep convolutional neural network DCNN). A machine learning model is built or obtained which is able to classify and detect fingerprints (distribution patterns). This model is then trained using training data comprising a labeled dataset of wafer sort maps, where the labels can be provided by human engineer annotation (e.g., supervised learning).

Once the similarity scores have been computed, the system will be able to identify each of the scanner metrology wafer maps which resembles (e.g., has a high similarity based on a similarity threshold to) the final wafer sort map. This process is commonly referred to as "Image Retrieval" or "Pattern Search"; an example system suitable for performing this step can be found in, for example, the publication "*Wafer Map Failure Pattern Recognition and Similarity Ranking for Large-Scale Data Sets*", IEEE Transactions on Semiconductor Manufacturing (Volume: 28, Issue: 1, February 2015), which is hereby incorporated herein by reference.

If this wafer map "fingerprint retrieval" system returns (i.e., identifies as similar) the scanner metrology fingerprint from a particular layer, this indicates that the scanner sensor can identify the same non-random spatial failure pattern as observed in the end-of-line wafer sort map. It is therefore likely that the process steps prior to this particular exposure step are very likely to be responsible for the yield excursion. Furthermore, if the layer sequence information (in terms of processing order) is available, this can be combined with the fingerprint similarity score to further narrow down the list of process steps. Specifically, if the scanner metrology from layer i does not show similarity to the wafer sort map fingerprint but the one from layer i+1 does, then the process issues are very likely to occur between these two exposure steps (i and i+1).

As such, given a target yield wafer map or sort map with an "interesting" observed spatial signature/fingerprint (e.g., a failure pattern with significant failure rate), and through-stack scanner metrology wafer maps for the same wafer, the method proposes ranking scanner metrology wafer maps according to how similar they are to the target yield wafer map of interest. Optionally, if the sequence information for all the layers is known, it is possible to identify where the process issues begins.

Figure 5:
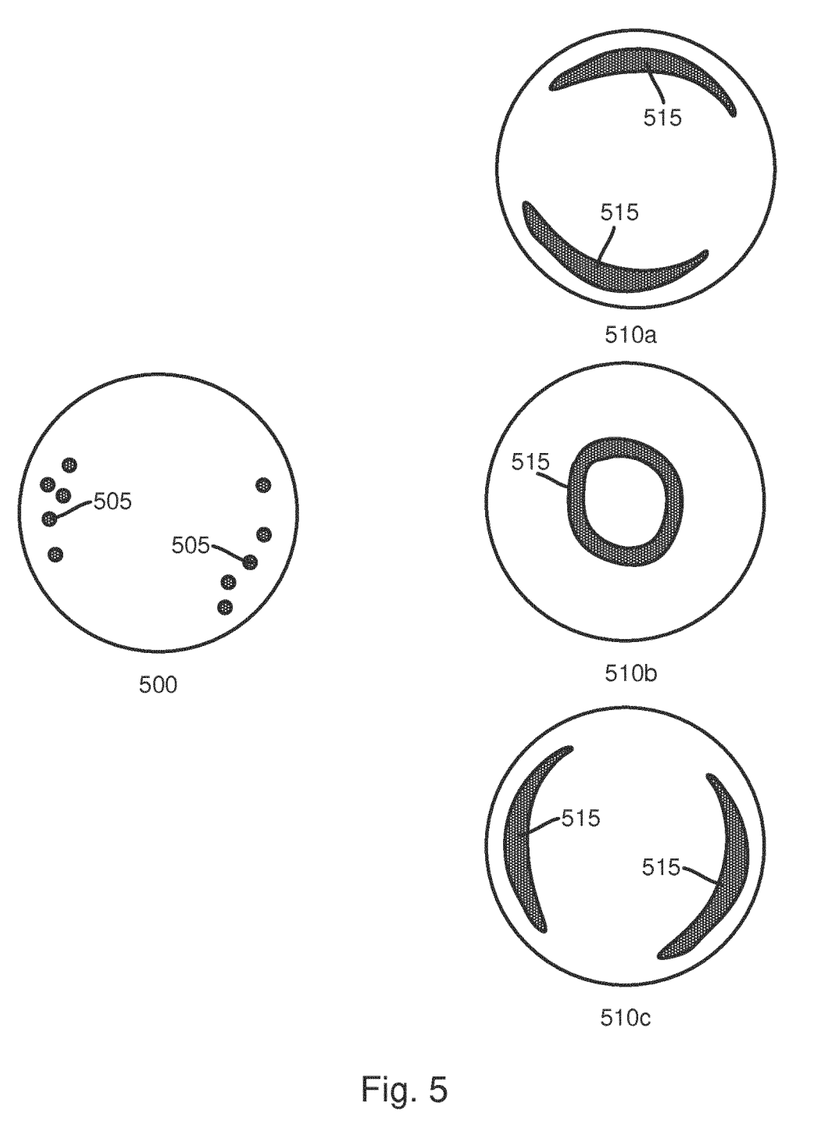
FIG. 5 is a schematic illustration of pattern recognition and similarity ranking between scanner fingerprints and electrical probe data corresponding to the same wafer.

FIG. 5 is a schematic illustration of this image retrieval concept. The figure shows a sort map fingerprint 500, where the shaded circles 505 indicate out of specification probe measurements. Also shown are three scanner metrology fingerprints 510a, 510b, 510c, each corresponding to three successive layers making up the wafer which is the subject of the sort map fingerprint 500. The shaded regions 515 are regions where values for a process parameter characterized by the scanner metrology fingerprints 510a, 510b, 510c show a significant deviation relative to the rest of the wafer. The image retrieval will recognize that metrology fingerprint 510c has a high similarity to the sort map fingerprint 500, and as such, will attribute the highest similarity metric to this fingerprint 510c. As the pattern of the fingerprint for the immediately preceding layer 510b is largely dissimilar to the sort map fingerprint 500, it is likely that the root cause issue for the out of specification probe measurements 505 are caused during processing of the layer corresponding to fingerprint 510c. As such, the context for this layer should be investigated.

A complementary approach to the fingerprint matching/retrieval on a per-wafer basis as described, is to extract the wafer-to-wafer scanner metrology variation fingerprint using any suitable technique (e.g., via a component analysis technique such as PCA (principal component analysis)) and correlate the activations/scores of these fingerprints per wafer with the wafer-level yield score (percentage of yielding dies) and/or the activations/scores for wafer-to-wafer wafer sort map variation fingerprints. This can make it easier to identify where an issue/problem occurs and/or problematic tools or processes.

It should be noted that the method described above is not only applicable to analysis of inter-field fingerprints as described, but also to intra-field fingerprints. In such an embodiment, the intra-field fingerprints can be extracted by performing a field average over the wafer sort map and scanner metrology wafer maps.

Returning to FIG. 4, step 440 comprises performing context linking between the scanner metrology fingerprints with the context data, in a similar fashion as the yield-based context linking, and identify the final root cause in terms of step/tool/tool parameters.

In addition to the two-stage flow described, another potential use case is to use the similarity between the wafer sort map and scanner metrology fingerprint to validate the root cause findings from a previous performed direct linking 450 between the wafer sort map fingerprints with the context information.

Once the training/setup is complete, the pre-trained deep learning-based fingerprint detection and classification system can be used to report the fingerprint activation/presence in the scanner metrology of newly exposed wafers in real-time (e.g., at measurement of the problematic layer). This can be used to monitor whether there is any recurrence of the process issue previously identified, which will eventually lead to yield excursion event prior to wafer completion and electrical testing.

As such, a method is described where, instead of trying to find the root cause from all process steps through-stack, only the process steps prior to a layer of interest where the scanner metrology can pick up the systematic yield loss needs to be analyzed. Additionally, current context linking methodology developed for wafer level grouping techniques should still be applicable to the methods herein. Wafer level grouping techniques are described, for example, in WO2018/072962 which is incorporated herein by reference. The probe fingerprint library and knowledge database can be expanded to include the highly-correlating scanner metrology fingerprint (the first layer where the fingerprint appears), and the scanner sensor measurement from that layer then used to setup process monitoring. Separate trend charts can be setup to monitor the fingerprint presence for each failure type, based on a fingerprint presence score (e.g., a similarity score indicating the presence of a fingerprint type or particular pattern). Failure types may include (purely for example) donut shapes (e.g., as indicated by 510b in FIG. 5), edge rings, any local groupings including a center grouping or edge grouping, a saddle shape, a "scratch" shape.

Faster turn-around time is expected for root-cause analysis using the techniques described herein. Compared to direct linking between the wafer sort map fingerprint and the wafer context, only the portion of the process history before the exposure layer where the scanner metrology wafer maps detects and pick up process excursions need to be examined, which can potentially greatly reduce the number of candidate root causes, especially if the excursion arises early in the process stack. Increased accuracy is also expected, when compared to direct linking between the wafer sort map fingerprint and the wafer context. Much fewer potential false positive root cause findings due to convoluted/non-randomized wafer fab routes should be observed.

For process issue recurrence monitoring, the process issue recurrence can potentially be detected much earlier before the wafer sort data becomes available. Fingerprint-based monitoring approach offers richer insights into the process issues compared to conventional monitoring techniques (e.g., a single KPI per wafer).

The merits of using scanner metrology fingerprints and their derivatives is that, similarly to the wafer sort map information, the scanner metrology information is available for every single wafer at every single exposure step. It is also possible (and within the scope of the present disclosure) to perform the fingerprint matching/retrieval methods described herein based on other sampled metrology (e.g., scatterometer or scanning electron microscope metrology) such as any one or more of focus, CD, and overlay measurements. However, this type of metrology information is not always available for every single wafer, which limits the accuracy of the root cause analysis and the effectiveness of the process issue recurrence monitoring system.

The merits of the deep learning approach described herein is that it is a fully automated process which significantly reduces the engineering time or time to process insight. It is a purely data-driven approach, no feature engineering required, which also means computer vision expertise and prior knowledge of the fabrication process issues is not required. However other approaches are possible and within the scope of this disclosure. One such approach comprises a manual visual inspection of the wafer sort map and associated through-stack scanner metrology wafer map. However, this would be very labor intensive and time consuming.

Another option comprising using a similarity ranking system based on computer vision and/or domain knowledge-driven feature extractions. However, this requires computer vision expertise (know-how) and prior knowledge of the fab process issues.

Further embodiments are disclosed in the list of numbered clauses below:

1. A method for determining a root cause affecting yield in a manufacturing process for manufacturing a substrate, the method comprising;
   obtaining yield distribution data comprising the distribution of a yield parameter over the substrate or part thereof;
   obtaining metrology data corresponding to the yield distribution data and comprising a spatial variation of a process parameter over the substrate or part thereof;
   comparing the yield distribution data and metrology data; and
   determining the root cause based on the comparison.
2. A method according to clause 1, wherein said comparison determines a similarity metric describing a spatial similarity between the yield distribution data and each one of different sets of the metrology data, each set corresponding to a different layer of the substrate.
3. A method according to clause 2, wherein said comparison comprises performing a correlation analysis between the yield distribution data and metrology data, based on an encoding into informative semantic feature vectors.
4. A method according to clause 2 or 3, wherein the metrology data comprises a set of metrology data for each layer of the manufacturing process.
5. A method according to any of clauses 2 to 4, comprising ranking the sets of metrology data according to the similarity metric.
6. A method according to any of clauses 2 to 5, comprising determining a first similar set of metrology data out of the sets of metrology data, being the first set of metrology data in terms of processing order for the corresponding layers, which is determined to be similar to the yield distribution data.
7. A method according to clause 6, wherein said determining a first similar set of metrology data comprises determining the first similarity metric to exceed a threshold and/or determining a first similarity metric immediately subsequent to a jump in the similarity thresholds.
8. A method according to clause 6 or 7, comprising flagging context relating to the layer corresponding to said first similar set of metrology data for further root cause analysis.
9. A method according to any of clauses 6 to 8, comprising giving lesser or zero weight to context relating to all layers subsequent to said layer corresponding to said first similar set of metrology data.
10. A method according to any preceding clause, wherein the yield distribution data comprises a particular yield failure pattern.
11. A method according to any preceding clause, comprising performing a component analysis to extract one or more substrate-to-substrate metrology data variation distributions from the metrology data; and
    correlating the activations and/or scores of these substrate-to-substrate metrology data variation distributions per substrate with either:
    a substrate-level yield score, or
    corresponding activations and/or scores for substrate-to-substrate yield distribution data variation distributions.
12. A method according to any preceding clause, wherein the yield distribution data and metrology data each comprise inter-field distribution data.
13. A method according to any of clause 1 to 11, wherein the yield distribution data and metrology data each comprise intra-field distribution data, said intra-field distribution data having been extracted by performing a field average over the corresponding measured inter-field distribution data.
14. A method according to any preceding clause, wherein the comparing step is performed using a model trained to classify and/or detect distribution patterns.
15. A method according to clause 14, wherein said model is a machine learning model having been trained on training data comprising labeled yield distribution data.
16. A method according to clause 15, wherein said machine learning model comprises a convolutional neural network model.
17. A method according to clause 15 or 16, further comprising using said model in a monitoring step of monitoring a manufacturing process for manufacturing a substrate, said step comprising using said model to flag a potential issue based on production metrology data.
18. A method according to clause 17, wherein said production metrology data comprises sets of production metrology data, each set corresponding to a different layer of the substrate, and said monitoring step comprises using said model to determine a similarity of each set of production metrology data to one or more failure patterns previously observed in historic yield distribution data.
19. A method for monitoring a manufacturing process for manufacturing a substrate, the method comprising;
    obtaining a trained model relating yield distribution data and metrology data, said trained model being trained by comparison of training sets of metrology data and training yield distribution data corresponding to said manufacturing process;
    obtaining sets of production metrology data, each set comprising a spatial variation of a process parameter corresponding to a different layer of the substrate or part thereof;
    using the trained model to determine a similarity metric for each of the sets of production metrology data to one or more failure patterns in the historic yield distribution data comprising a particular yield failure pattern; and
    flagging a potential issue if the similarity metric exceeds a threshold.
20. A method according to any preceding clause, wherein any of the metrology data relates to metrology performed by a lithographic apparatus as part of a preparatory step before exposure of a layer.
21. A method according to clause 20, wherein the metrology data comprises alignment data performed by an alignment sensor and/or levelling data performed by a level sensor of the lithographic apparatus, and/or metrology data derived from the alignment data and/or levelling data.
22. A method according to any preceding clause, wherein any of the yield distribution data comprises electrical sort test data.

23. A computer program comprising program instructions operable to perform the method of any of clauses 1 to 22, when run on a suitable apparatus.
24. A non-transient computer program carrier comprising the computer program of clause 23.
25. A processing system comprising a processor and the computer program of clause 23.
26. A lithographic manufacturing apparatus comprising the processing system of clause 25.

Although specific reference may be made in this text to the use of lithographic apparatus in the manufacture of ICs, it should be understood that the lithographic apparatus described herein may have other applications. Possible other applications include the manufacture of integrated optical systems, guidance and detection patterns for magnetic domain memories, flat-panel displays, liquid-crystal displays (LCDs), thin-film magnetic heads, etc.

Although specific reference may be made in this text to embodiments of the invention in the context of a lithographic apparatus, embodiments of the invention may be used in other apparatus. Embodiments of the invention may form part of a mask inspection apparatus, a metrology apparatus, or any apparatus that measures or processes an object such as a wafer (or other substrate) or mask (or other patterning device). These apparatus may be generally referred to as lithographic tools. Such a lithographic tool may use vacuum conditions or ambient (non-vacuum) conditions.

Although specific reference may have been made above to the use of embodiments of the invention in the context of optical lithography, it will be appreciated that the invention, where the context allows, is not limited to optical lithography and may be used in other applications, for example imprint lithography.

While specific embodiments of the invention have been described above, it will be appreciated that the invention may be practiced otherwise than as described. The descriptions above are intended to be illustrative, not limiting. Thus it will be apparent to one skilled in the art that modifications may be made to the invention as described without departing from the scope of the claims set out below.

The invention claimed is:

1. A method for determining a root cause affecting yield in a process for manufacturing devices on a substrate, the method comprising:
    obtaining yield distribution data comprising a distribution of a yield parameter across the substrate or part thereof;
    obtaining sets of metrology data, the metrology data of each set comprising a spatial variation of a process parameter over the substrate or part thereof and each set corresponding to a different layer of the substrate;
    comparing the yield distribution data and metrology data based on a similarity metric describing a spatial similarity between the yield distribution data and an individual set out of the sets of the metrology data, the comparing comprising executing, by a hardware computer system, a computer model trained on measurement data of one or more substrates and on yield data of the one or more substrates to obtain the similarity metric; and
    determining a first similar set of metrology data out of the sets of metrology data, being the first set of metrology data in terms of processing order for the corresponding layers, which is determined to be similar to the yield distribution data.

2. The method as claimed in claim 1, wherein the comparing comprises performing a correlation analysis between the yield distribution data and metrology data, based on an encoding into informative semantic feature vectors.

3. The method as claimed in claim 1, comprising ranking the sets of metrology data according to the similarity metric.

4. The method as claimed in claim 1, wherein the determining a first similar set of metrology data comprises determining the first similarity metric to exceed a threshold and/or determining a first similarity metric immediately subsequent to a jump in the similarity threshold.

5. The method as claimed in claim 1, comprising flagging context relating to the layer corresponding to the first similar set of metrology data for further root cause analysis.

6. The method as claimed in claim 5, comprising giving lesser or zero weight to context relating to all layers subsequent to the layer corresponding to the first similar set of metrology data.

7. The method as claimed in claim 1, comprising performing a component analysis to extract one or more substrate-to-substrate metrology data variation distributions from the metrology data; and correlating an activation and/or score of the one or more substrate-to-substrate metrology data variation distributions per substrate with either a substrate-level yield score, or a corresponding activation and/or score for one or more substrate-to-substrate yield distribution data variation distributions.

8. The method as claimed in claim 1, wherein the model is a machine learning model having been trained on training data comprising labeled yield distribution data.

9. The method as claimed in claim 8, wherein the machine learning model comprises a convolutional neural network model.

10. The method as claimed in claim 1, further comprising using the model in monitoring a manufacturing process for manufacturing a substrate, including using the model to flag a potential issue based on production metrology data.

11. The method as claimed in claim 10, wherein the production metrology data comprises sets of production metrology data, each set corresponding to a different layer of the substrate, and
    the monitoring comprises using the model to determine a similarity of each set of production metrology data to one or more failure patterns previously observed in historic yield distribution data.

12. The method as claimed in claim 1, wherein the metrology data sets relate to metrology performed by a lithographic apparatus as part of a preparatory step before exposure of a layer.

13. The method as claimed in claim 1, wherein the yield distribution data comprises electrical sort test data.

14. A method for monitoring a manufacturing process for manufacturing a substrate, the method comprising:
    obtaining a trained computer model relating yield distribution data and metrology data, the trained computer model trained by comparison of training sets of metrology data and training yield distribution data corresponding to the manufacturing process;
    obtaining sets of production metrology data, the production metrology data of each set comprising a spatial variation of a process parameter and each set corresponding to a different layer of the substrate or part thereof;
    executing, by a hardware computer system, the trained computer model to determine a similarity metric for each of the sets of production metrology data to one or more failure patterns in the historic yield distribution data comprising a particular yield failure pattern; and flagging a potential issue if the similarity metric meets or exceeds a threshold.

15. A computer program product comprising a non-transitory computer-readable medium having instructions therein, the instructions, when executed by a computer system, configured to cause the computer system to at least:
obtain yield distribution data for a process for manufacturing devices on a substrate, the yield distribution data comprising a distribution of a yield parameter across the substrate or part thereof;
obtain sets of metrology data, the metrology data of each set comprising a spatial variation of a process parameter over the substrate or part thereof and each set corresponding to a different layer on the substrate;
compare the yield distribution data and metrology data based on a similarity metric describing a spatial similarity between the yield distribution data and an individual set out of the sets of the metrology data, the comparison comprising execution of a computer model trained on measurement data of one or more substrates and on yield data of the one or more substrates to obtain the similarity metric; and
determine a first similar set of metrology data out of the sets of metrology data, being the first set of metrology data in terms of processing order for the corresponding layers, which is determined to be similar to the yield distribution data.

16. The computer program product as claimed in claim 15, wherein the instructions are further configured to cause the computer system to flag context relating to the layer corresponding to the first similar set of metrology data for further root cause analysis.

17. The computer program product as claimed in claim 15, wherein at least some of the metrology data relates to metrology performed by a lithographic apparatus as part of a preparatory step before exposure of a layer.

18. The computer program product as claimed in claim 15, wherein the instructions are further configured to cause the computer system to rank the sets of metrology data according to the similarity metric.

19. A computer program product comprising a non-transitory computer-readable medium having instructions therein, the instructions, when executed by a computer system, configured to cause the computer system to at least:
obtain a trained computer model relating yield distribution data and metrology data, the trained computer model trained by comparison of training sets of metrology data and training yield distribution data corresponding to a manufacturing process for manufacturing a substrate;
obtain sets of production metrology data, the production metrology data of each set comprising a spatial variation of a process parameter and each set corresponding to a different layer of the substrate or part thereof;
execute the trained computer model to determine a similarity metric for each of the sets of production metrology data to one or more failure patterns in the historic yield distribution data comprising a particular yield failure pattern; and
flag a potential issue if the similarity metric meets or exceeds a threshold.

20. The computer program product as claimed in claim 19, wherein at least some of the metrology data relates to metrology performed by a lithographic apparatus as part of a preparatory step before exposure of a layer.

* * * * *